United States Patent

Alhussien et al.

(10) Patent No.: US 9,405,624 B2
(45) Date of Patent: Aug. 2, 2016

(54) ON-DIE ERROR DETECTION AND CORRECTION DURING MULTI-STEP PROGRAMMING

(71) Applicant: Seagate Technology LLC, Cupertino, CA (US)

(72) Inventors: AbdelHakim S. Alhussien, San Jose, CA (US); Jeremy Werner, San Jose, CA (US); Erich F. Haratsch, San Jose, CA (US); Earl T. Cohen, Cupertino, CA (US)

(73) Assignee: Seagate Technology LLC, Cupertino, CA (US)

( * ) Notice: Subject to any disclaimer, the term of this patent is extended or adjusted under 35 U.S.C. 154(b) by 110 days.

(21) Appl. No.: 14/308,911

(22) Filed: Jun. 19, 2014

(65) Prior Publication Data

US 2015/0372697 A1 Dec. 24, 2015

(51) Int. Cl.
| | |
|---|---|
| *G11C 29/00* | (2006.01) |
| *G06F 11/10* | (2006.01) |
| *H03M 13/29* | (2006.01) |
| *H03M 13/11* | (2006.01) |
| *H03M 13/15* | (2006.01) |
| *H03M 13/19* | (2006.01) |
| *H03M 13/23* | (2006.01) |
| *H03M 13/37* | (2006.01) |
| *H03M 13/43* | (2006.01) |

(52) U.S. Cl.
CPC ....... *G06F 11/1076* (2013.01); *H03M 13/2909* (2013.01); *H03M 13/1102* (2013.01); *H03M 13/1108* (2013.01); *H03M 13/152* (2013.01); *H03M 13/19* (2013.01); *H03M 13/23* (2013.01); *H03M 13/3746* (2013.01); *H03M 13/43* (2013.01)

(58) Field of Classification Search
CPC .............. H03M 13/29; H03M 13/356; H03M 13/2906; H03M 13/1102; G06F 11/1076; G06F 11/1072; G06F 11/1016; G06F 11/10; G11C 7/1006; G11C 11/5628; G11C 16/10; G11C 29/04; G11C 29/50016; G11C 2029/5002; G11C 5/147; G11C 16/30; G11C 2029/0411
See application file for complete search history.

(56) References Cited

U.S. PATENT DOCUMENTS

| | | | | |
|---|---|---|---|---|
| 8,225,067 | B2 | 7/2012 | Chu et al. | 711/202 |
| 8,495,467 | B1 | 7/2013 | Billing et al. | 714/764 |
| 8,621,318 | B1 | 12/2013 | Micheloni et al. | 714/755 |
| 8,984,369 | B2* | 3/2015 | Varanasi | G11C 7/1006 365/185.02 |
| 2009/0019321 | A1* | 1/2009 | Radke | G11C 11/56 714/54 |
| 2009/0164704 | A1 | 6/2009 | Kanade et al. | 711/103 |
| 2011/0209028 | A1* | 8/2011 | Post | G06F 11/1068 714/758 |
| 2013/0024743 | A1* | 1/2013 | Sharon | G06F 11/1072 714/763 |
| 2013/0305120 | A1* | 11/2013 | Torii | G06F 11/1008 714/764 |
| 2014/0063940 | A1* | 3/2014 | Chen | G11C 11/5628 365/185.03 |
| 2014/0082456 | A1 | 3/2014 | Liu | 714/764 |
| 2015/0161001 | A1* | 6/2015 | Cometti | G06F 11/1072 714/773 |
| 2015/0254131 | A1* | 9/2015 | Torii | G11C 29/52 714/764 |

* cited by examiner

*Primary Examiner* — Guerrier Merant
(74) *Attorney, Agent, or Firm* — Christopher P. Maiorana, PC (57) ABSTRACT

An apparatus having a memory and a controller is disclosed. The memory is configured to (i) program a protected lower unit in a lower page of a location, (ii) generate a corrected lower unit by correcting the protected lower unit using a first error correction code and (iii) program a protected upper unit in an upper page of the location based on the corrected lower unit. The controller is configured to generate the protected upper unit by encoding an upper write data item using a second error correction code. The controller is on a separate die as the memory.

20 Claims, 7 Drawing Sheets

ON-DIE ERROR DETECTION AND CORRECTION DURING MULTI-STEP PROGRAMMING

FIELD OF THE INVENTION

The invention relates to nonvolatile memory storage generally and, more particularly, to a method and/or apparatus for implementing on-die error detection and correction during multi-step programming.

BACKGROUND

Programming the states of a multi-level cell in a flash memory is a two-phase process. In a first phase, a least-significant-bit page is written to an intermediate state if not an erased bit. In a second phase, the least-significant-bit page is sensed by the flash memory and thereafter the least-significant-bit page and a most-significant-bit page are written to the flash memory. Since the most-significant-bit page is written based on the sensed least-significant-bit page without passing the read data through an error correction process in a controller, the final programmed state may be in error. The error mechanism arises from a rough distribution of intermediate states intersecting with an erased state. Programming to a wrong state causes write errors with high-magnitude soft-decoding information of the wrong signs at an input of a soft-decision decoder. Such errors degrade the performance of the soft-decision decoder in an error floor region.

Compacting several single-level-cell pages into a triple-level-cell page is subject to the same phenomena. Write errors created while reading the single-level-cell pages carry into the triple-level-cell page if not corrected first. The write errors can affect the success rate of soft-decision decoding of the triple-level-cell data.

SUMMARY

The invention concerns an apparatus having a memory and a controller. The memory is configured to (i) program a protected lower unit in a lower page of a location, (ii) generate a corrected lower unit by correcting the protected lower unit using a first error correction code and (iii) program a protected upper unit in an upper page of the location based on the corrected lower unit. The controller is configured to generate the protected upper unit by encoding an upper write data item using a second error correction code. The controller is on a separate die as the memory.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing on-die error detection and correction during multi-step programming that may (i) perform error detection on the same die as the stored data, (ii) perform error correction on the same die as the stored data, (iii) reduce a number of errors on the same die as the stored data prior to sending the data to a controller, (iv) have a low latency, (v) consume a small amount of space to implement, and/or (vi) be implemented as one or more integrated circuits.

Various embodiments of the invention use a low cost, low complexity, and low latency error correction code (e.g., ECC)/error detection code (e.g., EDC) that is instantiated on the same die as the stored data. For a multi-step (e.g., two-step) write that involves writing and later reading a lower-page intermediate-state page (e.g., a lower-page only page), a page-level (or higher granularity) error correction code/error detection code is implemented. To compact multiple single-level-cell pages into a triple-level-cell page, a page-level error correction code/error detection code that can also be decoded on other granularities than the page level is implemented. Since lower-page intermediate-state read errors are mostly asymmetric, where the lower-page intermediate-state reads suffer mostly from endurance induced errors, an error detection code that detects errors based on drift of read disparity is generally implemented. The time between a least-significant-bit page write and a most-significant-bit page write is usually short. Hence, errors that change the logical ones (e.g., 1's) in a normal erased state to logical zeros (e.g., 0's) in a normal programmed state (or vice-versa) are dominant compared with errors that change 0's to 1's, which is based on the current convention that the erased state corresponds to a logical 1. The error asymmetry can be used in more efficient system designs to reduce the occurrence of write errors.

For instance, various embodiments of the invention use a disparity code to utilize lower-page intermediate-state asymmetric errors. Such a disparity code provides a powerful error detection mechanism for flash read channels dominated by asymmetric errors. The disparity code counts the number of 1's that are more than the number of 0's in each small section of the written flash page and stores the count (optionally protected with an error correction code/error detection code) at the end of the subpage/section of the page. The disparity error detection code can be also used in conjunction with multiple reads of the lower-page intermediate-state page. As such, multiple reads of the lower-page intermediate-state page at several pre-chosen reference sensing voltages are performed. An error detection code (e.g., like a disparity code) is subsequently used to choose which least-significant bit/lower-page intermediate-state read to pair with the most-significant bit page coming from a controller write command.

In triple-level-cell flash memory, to provide multi-page-level (such as erase block-level) error detection/error correction of the single-level-cell pages being compacted, the compacted single-level-cell pages are protected by an inner parity code. For example, the inner parity code may be a high-rate Hamming code that is a constituent code of a high code rate product code that has constituent codes preferably, but not necessarily, in an orthogonal dimension, such as a product of constituent codes across wordlines and bit-lines. In some embodiments of the product codes, some of the wordlines are the parity of the product code while the remaining wordlines hold user data, and the constituent codes work in conjunction with each other to clean the single-level-cell pages (that are part of the multi-page product code) before compaction into a triple-level-cell page.

Figure 1:
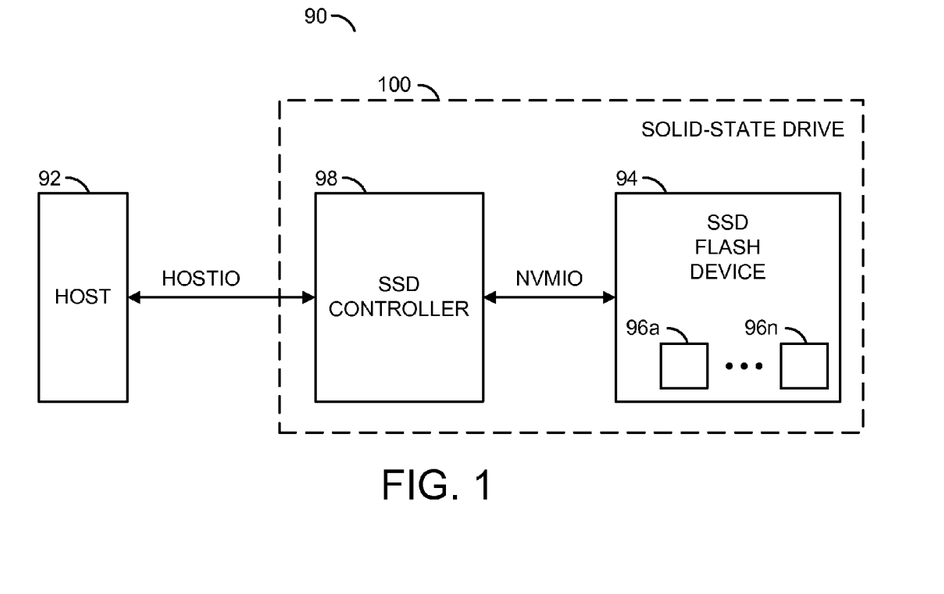
FIG. 1 is a block diagram of an apparatus.

Referring to FIG. 1, a block diagram of an example implementation of an apparatus 90 is shown. The apparatus (or circuit or device or integrated circuit) 90 implements a computer having a nonvolatile memory circuit. The apparatus 90 generally comprises a block (or circuit) 92, a block (or circuit) 94, one or more blocks (or circuits) 96a-96n and a block (or circuit) 98. The circuits 94 and 98 form a drive (or device) 100. The circuits 92 to 100 may be represented as modules and/or blocks, embodiments of which include hardware (circuitry), code (e.g., hardware description languages (HDLs) such as register-transfer level (RTL), Verilog, etc.) used by one or more electronic design tools, computer executable code in a storage device, software and associated hardware executing the software, and/or other implementations.

One or more signals (e.g., HOSTIO) are exchanged between the circuit 92 and the circuit 98. The host input/output signal HOSTIO generally includes, but is not limited to, a logical address component used to access data in the circuit 100, a host command component that controls the circuit 100, a write data component that transfers write data from the circuit 92 to the circuit 98 and a read data component that transfers error corrected read data from the circuit 98 to the circuit 92. One or more signals (e.g., NVMIO) are exchanged between the circuit 98 and the circuit 94. The nonvolatile memory input/output signal NVMIO generally includes, but is not limited to, a physical address component used to access data in the circuit 94, a memory command component that controls the circuit 94 (e.g., read or write commands), a write codeword component that carries error correction coded and cyclical redundancy check protected write codewords written from the circuit 98 into the circuit 94 and a read codeword component that carries the error correction coded codewords read from the circuit 94 to the circuit 98.

The circuit 92 is shown implemented as a host circuit. The circuit 92 is generally operational to read and write data to and from the circuit 94 via the circuit 98. When reading or writing, the circuit 92 transfers a logical address value in the signal HOSTIO to identify which set of data is to be written or to be read from the circuit 94. The address generally spans a logical address range of the circuit 100. The logical address can address individual data units, such as SATA (e.g., serial-ATA) sectors.

The circuit 94 is shown implementing one or more nonvolatile memory circuits (or devices) 96a-96n. According to various embodiments, the circuit 94 comprises one or more nonvolatile semiconductor devices. The circuit 94 is generally operational to store data in a nonvolatile condition. When data is read from the circuit 94, the circuit 94 accesses a set of data (e.g., multiple bits) identified by the address (e.g., a physical address) in the signal NVMIO. The address generally spans a physical address range of the circuit 94.

Data within the circuit 94 is generally organized in a hierarchy of units. An erase block is a smallest quantum of erasing. A page is a smallest quantum of writing. A codeword (or read unit or Epage or an error correction code page) is a smallest quantum of reading and error correction. Each block includes an integer number of pages with some padding bits where suitable. Each page generally includes an integer number of codewords. In some embodiments, codewords are enabled to span a page boundary of a multi-page unit. For example, some nonvolatile memory types are organized in planes that are operable in parallel, each plane comprising a plurality of the blocks. A multi-page unit, selected as a page from each plane, is thus writeable and readable as a single unit.

The circuits 96a-96n are generally implemented as NAND flash memory, NOR flash memory, flash memory using polysilicon or silicon nitride technology-based charge storage cells, two-dimensional or three-dimensional technology-based nonvolatile memory, ferromagnetic memory, phase-change memory, racetrack memory, resistive random access memory, magnetic random access memory and similar types of memory devices and/or storage media. Other nonvolatile memory technologies may be implemented to meet the criteria of a particular application.

In some embodiments, the circuits 96a-96n may be implemented as single-level-cell (e.g., SLC) type circuits. A single-level-cell type circuit generally stores a single bit per memory cell (e.g., a logical 0 or 1). In other embodiments, the circuits 96a-96n may be implemented as multi-level-cell type circuits. A multi-level-cell type circuit is capable of storing multiple (e.g., two) bits per memory cell (e.g., logical 00, 01, 10 or 11). In still other embodiments, the circuits 96a-96n may implement triple-level-cell type circuits. A triple-level-cell circuit stores multiple (e.g., three) bits per memory cell (e.g., a logical 000, 001, 010, 011, 100, 101, 110 or 111). A four-level cell type circuit may also be implemented. The examples provided are based on two bits per cell type devices and may be applied to all other types of nonvolatile memory.

As part of storing units of data, each circuit 96a-96n is configured to program a protected lower unit (e.g., codeword, page, or other unit) in a lower page of an addressed location. Each circuit 96a-96n is subsequently configured to generate a corrected lower unit by correcting the protected lower unit using an inner error correction code. Each circuit 96a-96n is subsequently configured to program a protected upper unit in an upper page of the addressable location based on the corrected lower unit.

The circuit 98 is shown implementing a controller circuit. The circuit 98 is generally operational to control reading to and writing from the circuit 94. The circuit 98 includes an ability to decode the read codewords received from the circuit 94. The resulting decoded data is presented to the circuit 92 via the signal HOSTIO and/or re-encoded and written back into the circuit 94 via the signal NVMIO. The circuit 98 comprises one or more integrated circuits (or chips or die) implementing the controller of one or more solid-state drives, embedded storage, or other suitable control applications. In some embodiments, the circuit 98 is on a separate die as the circuits 96a-96n.

As part of storing data, the circuit 98 generates the protected upper unit (e.g., codeword, page, or other unit) and the protected lower unit by encoding each of an upper write data item and a lower write data item independently using an outer error correction code. In various embodiments, the encoding of the upper write data item is generally performed separately from the encoding of the lower write data item as part of the storing of the data. The protected upper unit and the protected lower unit are presented to the circuit 94 in the signal NVMIO.

The circuit 100 is shown implementing a solid-state drive. The circuit 100 is generally operational to store data generated by the circuit 92 and return the data to the circuit 92. According to various embodiments, the circuit 100 comprises one or more: nonvolatile semiconductor devices, such as NAND Flash devices, phase change memory (e.g., PCM) devices, or resistive RAM (e.g., ReRAM) devices; portions of a solid-state drive having one or more nonvolatile devices;

and any other volatile or nonvolatile storage media. The circuit 100 is generally operational to store data in a nonvolatile condition.

Figure 2:
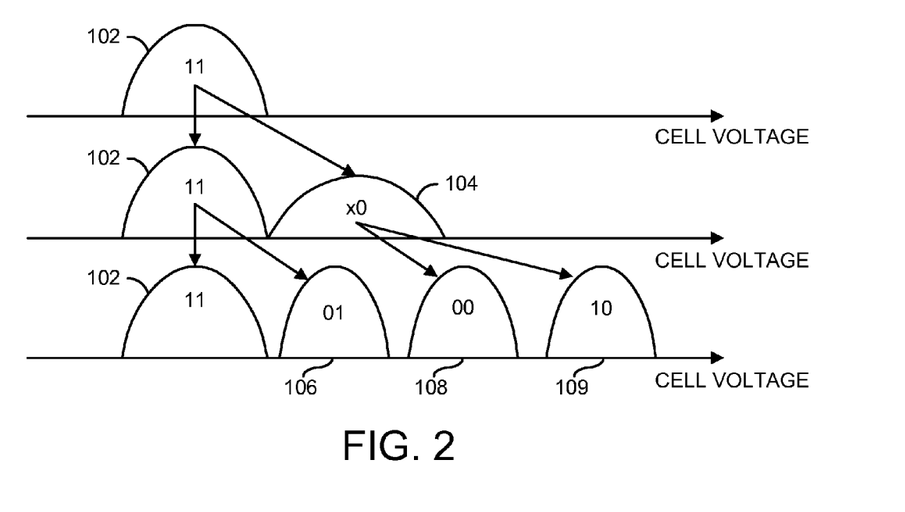
FIG. 2 is a diagram of a two-step programming process.

Referring to FIG. 2, a diagram of an example two-step programming process is shown. The process (or method) is illustrated for a multi-level cell in the circuits 96a-96n. All cells of an erased block are initially programmed (discharged) to an erased state 102. The erased state 102 generally represents multiple (e.g., two) bits, all with a logical one value (e.g., 11).

Given the two bits ($X_{MSB}$, $X_{LSB}$) to be stored in the cell, a charge is applied to the cell so that the voltage of the cell falls into the range that reflects the value of the least-significant bit of the two bits. The programming step results in a lower-page intermediate-state configuration. If the least-significant bit $X_{LSB}$ is a logical one, a null change is applied and the cell remains in the erased state 102 (e.g., 11). If the least-significant bit $X_{LSB}$ is a logical zero, a charge is applied to the cell to move the cell into an intermediate state 104 (e.g., X0).

The lower-page intermediate-state data is subsequently read to obtain a noisy value of the least-significant bits, denoted by $X'_{LSB}$. Given the value of the most-significant bit $X_{MSB}$, programming continues applying additional charge to the cell so that the cell voltage is moved (if possible) into the range corresponding to the bits ($X_{MSB}$, $X'_{LSB}$).

From the erased state 102, the additional charge is none if the most-significant bit is a logical one to leave the cell in the erased state 102. If the most-significant bit is a logical zero, additional change is added to the cell to shift the total charge to a state 106 (e.g., 01).

From the intermediate state 104, the additional charge is sufficient to move the cell into the state 108 (e.g., 00) if the most-significant bit is a zero. If the most-significant bit is a logical one, additional change is added to the cell to shift the total charge to a state 109 (e.g., 10).

The least-significant-bit page and the most-significant-bit page are written independently in the circuits 96a-96n to reduce cell-to-cell interference and to reduce write latency. The two step programming process is employed to reduce voltage swings that perturb physically adjacent cells that are electrically coupled to the programmed cell through parasitic capacitances. Otherwise, large voltage swings of one-shot programming generally result in more neighborhood cell disturb. Furthermore, incremental write latency is linearly proportional to the voltage swings.

As part of the two step programming, the least-significant-bit page is sensed by the flash memory before programming the full wordline, leading to possible mis-programming when the most-significant-bit page is programmed based upon a sensed value having an error. The least-significant-bit page is not stored (error free) in the circuit 98 after writing to the circuit 94 in part because the intermediate state X0 has a wide distribution and does not have as much separation from the erased state 11 as the final states. The least-significant-bit page sensing process before the most-significant bit page write adds latency and affects write throughput. Therefore, on-die error detection and correction codes are introduced to tradeoff latency (e.g., fast on-die decoding in write compared to off-die on-controller decoding) with mitigation of the write errors. The high-speed error detection and correction of the least-significant-bit pages before writing the most-significant-bit pages reduces the number of errors once both pages have been written into the circuit 96a-96n. Furthermore, the high code rates and simple encoding/decoding in circuit 96a-96n is practical to implement.

Figure 3:
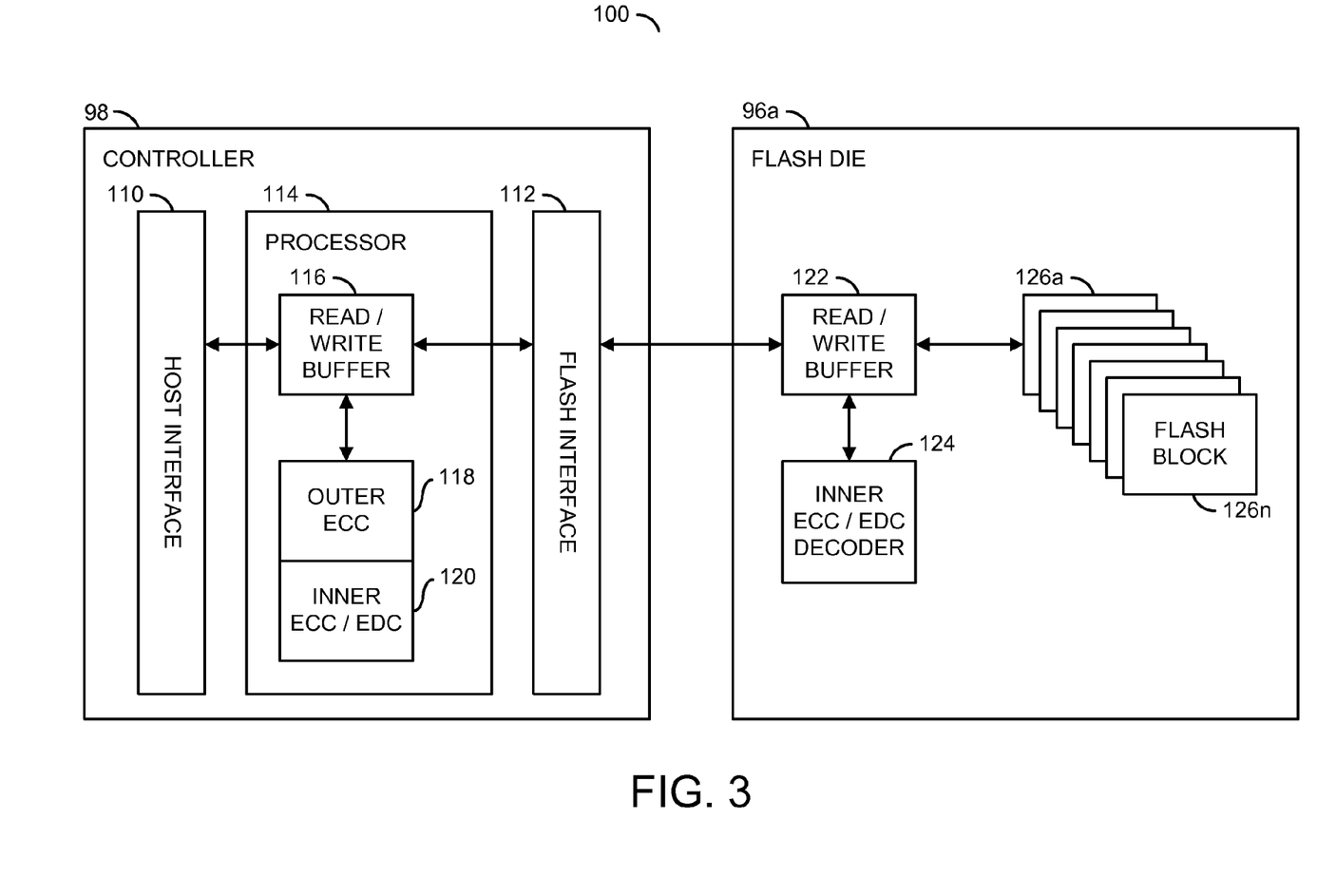
FIG. 3 is a block diagram of a circuit in accordance with an embodiment of the invention.

Referring to FIG. 3, a block diagram of an example implementation of the circuit 100 is shown in accordance with an embodiment of the invention. The circuit 100 generally comprises the circuits 96a-96n (only circuit 96a is shown for clarity), a block (or circuit) 110, a block (or circuit) 112, a block (or circuit) 114, a block (or circuit) 116, a block (or circuit) 118, and a block (or circuit) 120. Each circuit 96a-96n generally comprises a block (or circuit) 122, a block (or circuit) 124 and one or more blocks (or circuits) 126a-126n. The circuits 110 to 126n may be represented as modules and/or blocks, embodiments of which include hardware (circuitry), code (e.g., hardware description languages (HDLs) such as register-transfer level (RTL), Verilog, etc.) used by one or more electronic design tools, computer executable code in a storage device, software and associated hardware executing the software, and/or other implementations.

The circuit 110 is shown implemented as a host interface circuit. The circuit 110 is operational to provide communication with the circuit 92 via the signal HOSTIO. Other signals may be implemented between the circuits 92 and 110 to meet the criteria of a particular application.

The circuit 112 is shown implemented as a nonvolatile memory (e.g., flash) interface circuit. The circuit 112 is operational to provide communication with the circuit 94 via the signal NVMIO. Other signals may be implemented between the circuits 94 and 112 to meet the criteria of a particular application.

The circuit 114 is shown implemented as a processor circuit. The circuit 114 is operational to command and/or assist with the multiple read/write requests and to control one or more reference sensing voltages used in the circuit 94 to read the codewords. In various embodiments, the circuit 114 is operational to calculate the soft-decision information used by the circuit 118 and/or the circuit 120. For some types of nonvolatile memory, the soft-decision information is generated based on one or more reads of a given codeword from the circuit 94 at different reference sensing voltages. Other types of flash memory are able to provide a form of the soft-decision information directly, such as a coarse (e.g., 3-bit resolution) voltage-level for each bit position. The soft-decision information is stored in the circuit 116.

The circuit 116 is shown implemented as a buffer circuit. The circuit 116 is operational to buffer codewords received from the circuit 94 via the circuit 112. The circuit 116 also buffers soft-decision information (e.g., log-likelihood ratios) generated by the circuit 114. The read codewords and the soft-decision information are presented from the circuit 116 to the circuits 118 and/or 120.

The circuit 118 is shown implemented as an outer error correction code/error detection code circuit. The circuit 118 is generally operational to create (encode) outer error correction code information (e.g., parity bits) prior to transferring encoded data to the circuit 120. In some embodiments, the outer error correction code may be systematic. The circuit 118 is also operational to decode the encoded data read from the circuit 94. The decoding generally utilizes the outer error correction code to detect and correct zero or more errors. The error detection and correction codes generally operate at one or more of (i) a codeword level, (ii) a page level and (iii) another level, such as a multi-page level. In some embodiments, the circuit 118 implements a low-density parity check encoder/decoder. In other embodiments, the circuit 118 implements a Bose-Chaudhuri-Hocquenghem (e.g., BCH) encoder/decoder. Other hard-decision and/or soft-decision encoding/decoding techniques may be implemented to meet the criteria of a particular application.

The circuit 120 is shown implemented as an inner error correction code/error detection code circuit. The circuit 120 is generally operational to create (encode) inner error correction code information (e.g., parity bits) prior to transferring encoded data to the circuit 94. In some embodiments, the inner error correction code may be systematic. The circuit 120 is also operational to decode the encoded data read from the circuit 94. The decoding generally utilizes the inner error correction code to detect and correct zero or more errors. The error detection and correction codes generally operate at one or more of (i) a codeword level, (ii) a page level and (iii) another level, such as the multi-page level. In various embodiments, the circuit 120 implements a BCH encoder with a higher rate than the circuit 118. In other embodiments, the circuit 120 implements a Hamming encoder. Other encoders may be implemented to meet the criteria of a particular application, such as convolutional codes, and rate-less recursive or non-recursive pre-coders. In other embodiments, the inner error correction code encoder/decoder circuit 120 can be replaced by a low complexity version of the decoder of the off-memory-die outer error correction code decoder in the circuit 118. In that case, the circuit 118 implements the full strength decoder that potentially burns more power and is more complex, while the circuit 124 is a less complex, less power hungry version of the same decoder. For instance, the circuit 118 can be a minimum-sum low-density parity check decoder with multiple bits to represent messages running many local iterations, while the circuit 124 can a bit flipping-type low-density parity check decoder running few iterations or a majority logic decoder with 1 or 2 bits to represent log likelihood ratio values and running few iterations as well.

The circuit 122 is shown implemented as a buffer circuit. The circuit 122 is operational to buffer pages received from the circuit 98 via the circuit 112, the blocks 126a-126n and the circuit 124. In various embodiments, the circuit 122 generally buffers lower-page intermediate-state information (e.g., lower-page only information for cells storing 2 bits each) corrected by the circuit 124 prior to the second phase of a multi-step write process.

The circuit 124 is shown implemented as an inner error correction code/error detection code decoder circuit. The circuit 124 is generally operational to decode and correct the lower-page intermediate-state/least-significant-bit pages read from the blocks 126a-126n. The decoding generally utilizes the inner error correction code to detect and correct zero or more errors in each erroneous page. The corrected pages are transferred to the circuit 122 for temporary storage. In various embodiments, the circuit 124 implements a BCH decoder with a higher rate than the circuit 118. In other embodiments, the circuit 124 implements a Hamming decoder. Other low-latency, low-power decoders may be implemented to meet the criteria of a particular application.

Each block 126a-126n is shown implementing a flash erase block in a circuit 96a-96n. Each block 126a-126n is operational to store data in a nonvolatile form. Writing (or programming) the cells of the blocks 126a-126n may cause write errors. Reading from the cells of the blocks 126a-126n may cause read errors. In various embodiments, the circuit 124 is operational to correct the write/read errors of the lower-page intermediate-state/least-significant-bit pages prior to being combined with most-significant-bit pages and programmed back into the blocks 126a-126n.

Figure 4:
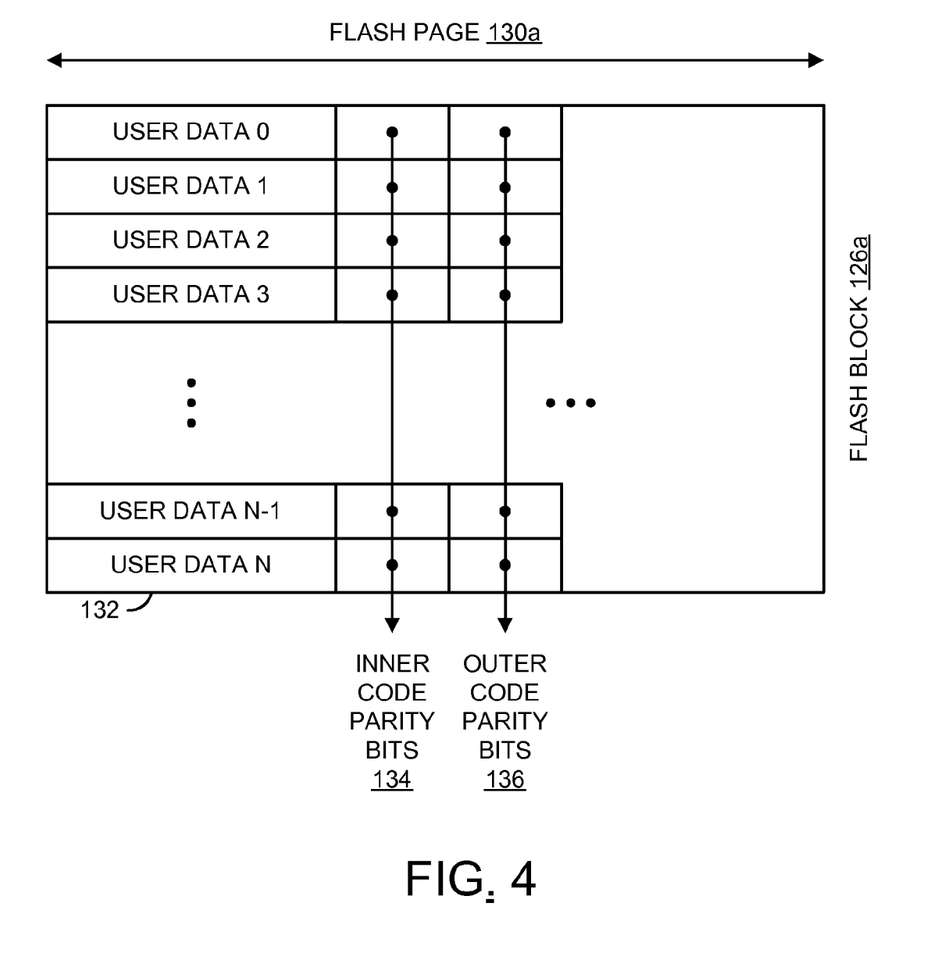
FIG. 4 is a diagram of a memory block.

Referring to FIG. 4, a diagram of an example block 126a is shown. The block 126a is representative of the other blocks 126b-126n. The block 126a generally comprises multiple pages each having a flash page width 130a. User data is generally stored in a user portion 132 of each page. Inner code parity bits 134 are stored in an error correction code portion of each page. In some embodiments, the inner code parity bits 134 may be adjoining (concatenated to) the user (data) portion 132. Outer code parity bits 136 are stored in another error correction code portion of each page. In various embodiments, the outer code parity bits 136 are adjoining (concatenated to) the inner code parity bits 134. Other arrangements for the user portions 132, inner code parity bits 134 and the outer code parity bits 136 may be implemented to meet the criteria of a particular application.

Each page includes one or more concatenated codewords and/or interleaved codewords. Each codeword is a combination of an outer, a BCH or low-density parity check code, and an inner BCH code or any other block code (in the error correction code, not flash, usage) or convolutional code. On the flash die, the inner code decoder circuit 124 corrects the inner code codeword made of the user data and the inner code parity. On-die inner code decoder circuit 124 is also invoked when compacting several (e.g., three) single-level-cell pages into a triple-level-cell page.

Returning to FIG. 3, the inner error correction code/error detection code (e.g., using the inner code parity bits 134) is combined with the outer error correction code (e.g., using the outer code parity bits 136) to correct/reduce write errors that, for example, arise from programming multi-level-cell wordlines and/or compacting single-level-cell pages into a triple-level-cell page. In some embodiments, the outer error correction code encoder (e.g., the circuit 118) is implemented in the circuit to create the outer code parity bits 136. In various embodiments, the inner error correction code encoder (e.g., circuit 120) is also implemented in the circuit 98 to create the inner code parity bits 134. In various embodiments, the inner error correction encoder (e.g., the circuit 120) is applied after the outer error correction encoder (e.g., the circuit 118) so that the outer parity bits 136 as well as the user portion 132 are protected by the inner code parity bits 134. Reverse concatenation is also possible as long as the inner and outer codes can be decoded partially or fully independent from each other.

In some embodiments, the inner code decoder (e.g., circuit 124) can be implemented in the flash die 96a-96n. In other embodiments, both the inner code encoder circuit 120 and the inner code decoder circuit 124 can be on the flash die 96a-96n and the error correction coding/error detection/error correction processes is seamless to the circuit 98. In various embodiments, both the inner code encoder circuit 120 and the inner code decoder circuit 124 can be in the circuit 98. In various embodiments the decoder of the circuit 118, or some reduced complexity version thereof, can be implemented on the flash die 96a-96n.

When reading a least-significant-bit page, the circuit 124 corrects the least-significant-bit page before writing the corresponding most-significant-bit page to the wordline. The inner code parity bits 134 can also be used in conjunction with multiple flash-internal reads of single-level-cell pages or least-significant-bit pages to reduce the occurrence of write errors seamless to the circuit 98.

In some embodiments, the inner error correction coding/error detection coding is encoded inside the circuit 98. A decoder (e.g., the circuit 124) is implemented in each circuit 96a-96n to match the inner encoding. When the least-significant-bit pages are read, the pages are decoded by the circuit 124 instead of being transferred to the circuit 98/114 for decoding. The on-die decoding of the inner error detection and correction is performed on the least-significant-bit pages before being paired up with the most-significant-bit pages, which are subsequently written as multi-level-cell wordlines.

When data is read from single-level-cell pages to be compacted into triple-level-cell pages, the data is decoded by the circuit 124 instead of being transferred to the circuit 98 for decoding. The circuit 124 generally provides low-latency decoding using, for example, a high-rate inner code on the die that matches the inner code of the circuit 120.

In the low-probability event that the circuit 124 fails to decode, the single-level-cell pages of data can be sent to the circuit 98 through the circuit 112 to be decoded by the circuit 118. The outer error correction code can be a strong, low-rate BCH code or low-density parity check code. The inner code can be a systematic, weaker, higher-rate BCH, Hamming, or any other low-latency, low-power decodable code. In some embodiments, the inner code is systematic so that the data can be encoded/decoded with the outer code independent from the inner code. In other embodiments, the inner code and the outer code are treatable as a product code and decoded in conjunction with each other. The inner code generally has a high rate, consumes little power, and has a low latency to decode since the inner code is encoded and/or decoded inside the circuits 96a-96n. In various embodiments, the outer code in the circuit 118 can be decoded via an on-flash-die decoder that consumes little power, occupies a small area, and has a low latency to decode. The lower correction capability of the on-die lower complexity decoders would be sufficient given the low error probability of single-level-cell pages and intermediate lower pages compared to triple-level cells and fully programmed multi-level cells, respectively.

Figure 5:
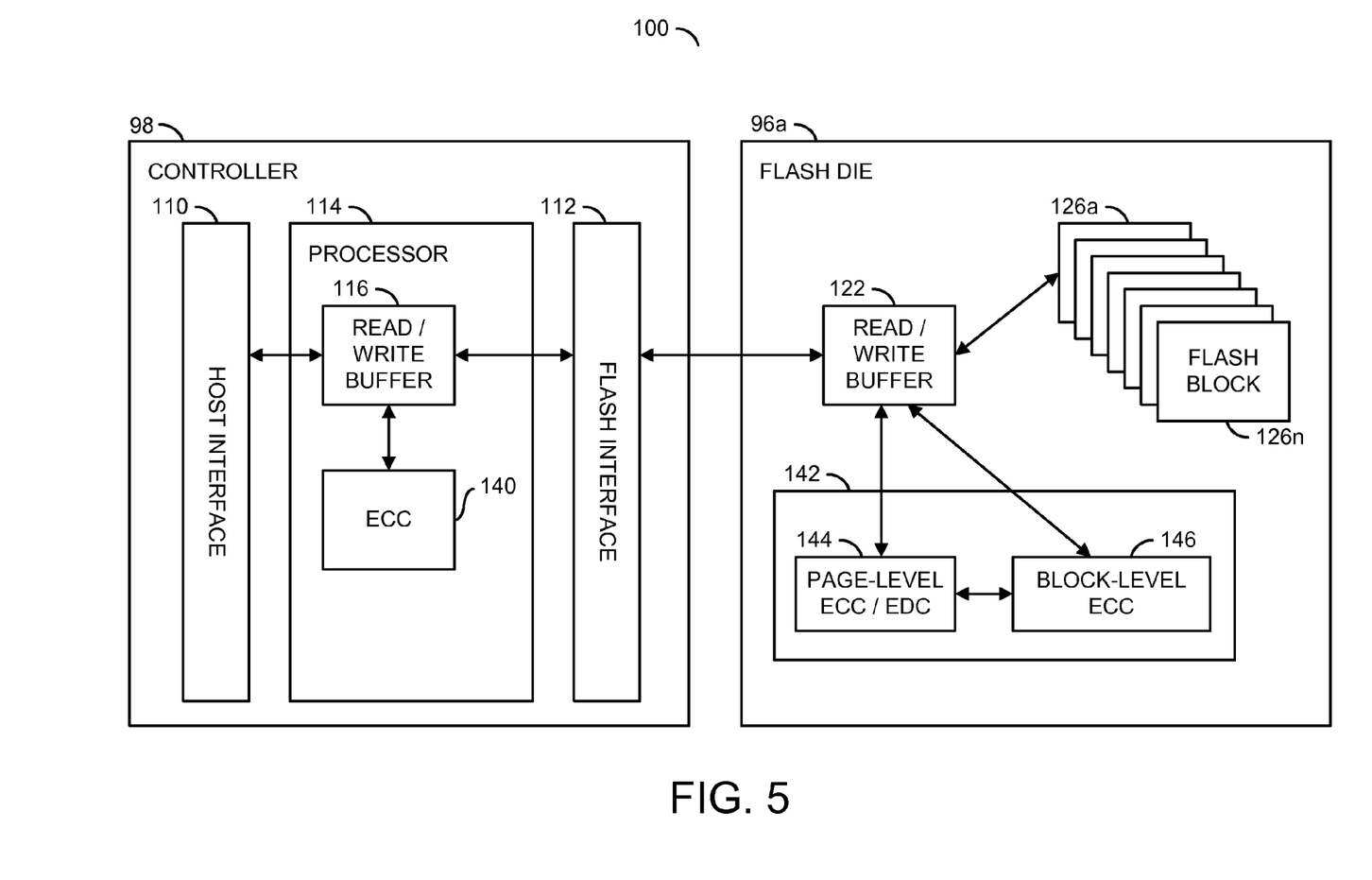
FIG. 5 is a block diagram of another implementation of the circuit.

Referring to FIG. 5, a block diagram of another example implementation of the circuit 100 is shown. The circuit 100 generally comprises the circuits 96a-96n (only circuit 96a is shown for clarity), the circuit 110, the circuit 112, the circuit 114, the circuit 116, and a block (or circuit) 140. Each circuit 96a-96n generally comprises the circuit 122, the circuits 126a-126n, and a block (or circuit) 142. The circuit 142 generally comprises a block (or circuit) 144 and a block (or circuit) 146. The circuits 110 to 146 may be represented as modules and/or blocks, embodiments of which include hardware (circuitry), code (e.g., hardware description languages (HDLs) such as register-transfer level (RTL), Verilog, etc.) used by one or more electronic design tools, computer executable code in a storage device, software and associated hardware executing the software, and/or other implementations.

The circuit 140 is shown implementing an error correction code circuit. The circuit 140 is operational to encode and decode data sent to and received from the circuit 94. The error detection and correction codes generally operate at one or more of (i) a codeword level, (ii) a page level and (iii) another level, such as a multi-page level.

The circuit 142 is shown implementing an on-die error correction code circuit. The circuit 142 is generally operational to detect and correct errors in the encoded data read from the blocks 126a-126n. The circuit 142 operates at a multi-page level, a page level, a codeword level and/or a bit-line level.

The circuit 144 is shown implementing a page-level error correction code/error detection code encoder/decoder circuit. The circuit 144 is operational to encode data at the page level. The circuit 144 is also operational to decode data at the page level. The decoding generally includes error detection and error correction.

The circuit 146 is shown implementing a multi-page (e.g., erase block level or portion thereof) error correction code/error detection code encoder/decoder circuit. The circuit 146 is operational to encode data at the multi-page level. The circuit 146 is also operational to decode data at the multi-page level. The decoding generally includes error detection and error correction. The circuit 142 places both the inner error correction/error detection code encoders and decoders on the flash die. The decoders in the circuit 142 can be low-complexity versions of the decoders in the circuit 114. For example, the circuit 142 may use only hard reads, while the more complex version in the circuit 114 can implement soft decoding based on multiple reads, direct soft reads, or can further decode jointly with the outer code in an iterative fashion, for instance. In addition to page-wise inner error correction/error detection code encoding, an error correction code on the multi-page level can be used to decode multiple pages. Pages can be decoded using the page-wise decoder when only a portion of all pages participating in the code are read, and the multi-page-level decoder can be used when all pages participating in the code are read. The multi-page level error correction code is encoded when enough data is available to fill a multi-page unit. For example, the multi-page-level decoder is invoked when data on a sufficient number of full single-level-cell pages is compacted into the triple-level-cell pages. The page-wise decoder is used when reading least-significant-bit pages before writing the most-significant-bit pages. In various embodiments, the decoders are best-effort decoders and the data may not be fully corrected. Furthermore, controller-side error correction (optionally performed in conjunction with on-die decoding) is responsible to deliver error-free data back to the circuit 92 with a low improper correction (mis-correction) probability.

One or more of several variations may be implemented in the embodiment illustrated in FIG. 5. In various embodiments, a disparity code is implemented in the circuit 142 to leverage lower-page intermediate-state asymmetric errors. Disparity accumulators make a powerful error detection mechanism for read channels dominated by asymmetric errors. The accumulators count the number of 1's that are more than the number of 0's in each (e.g., small) section of a page and store that count at the end of the section or the page. The disparity code result in a high code rate (e.g., (N-log 2 (worst case number of extra 1's))/N, N: data length).

In some embodiments, the lower-page intermediate-state data is read multiple times. The multiple reads are performed at several pre-chosen reference sensing voltages (e.g., Vrefs). Results based on an error detection code (like a disparity code) are used to choose what least-significant-bit/lower-page intermediate-state read page to pair with the most-significant-bit page received from the circuit 98.

In other embodiments, multi-page Hamming codes and product codes are applied to the triple-level-cell pages. Such codes provide high-code-rate codes, where the last few word-lines are the parity of the Hamming code. The codes generally work in conjunction with page-level error correction/error detection codes to clean the single-level-cell pages before compaction into the triple-level-cell pages.

In various embodiments, an inner on-die systematic code is concatenated with the outer controller-side error correction code. In such embodiments, both the inner code encoder and the inner code decoder are implemented in each circuit 96a-96n.

Figure 6:
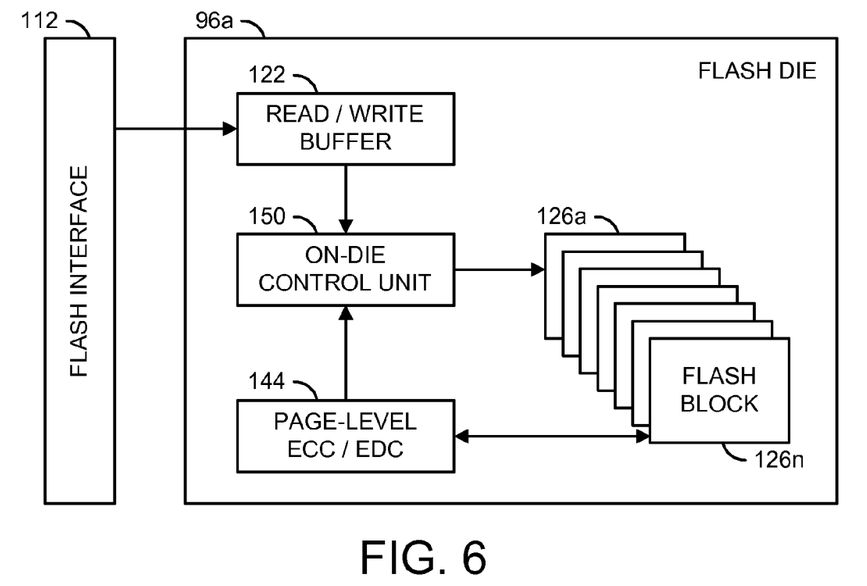
FIG. 6 is a diagram of lower-page intermediate-state sensing using on-die error detection and correction.

Referring to FIG. 6, a diagram of an example lower-page intermediate-state sensing using on-die error detection and correction is shown. The circuit 96a generally comprises the circuit 122, the circuits 126a-126n, the circuit 144, and a block (or circuit) 150. The circuits 112 to 150 may be represented as modules and/or blocks, embodiments of which include hardware (circuitry), code (e.g., hardware description languages (HDLs) such as register-transfer level (RTL), Verilog, etc.) used by one or more electronic design tools, computer executable code in a storage device, software and associated hardware executing the software, and/or other implementations.

The circuit 150 is shown implementing an on-die control unit circuit. The circuit 150 is generally operational to combine most-significant-bit pages with corrected least-significant-bit pages and write the resulting page into an addressed block 126a-126n.

The lower-page intermediate-state sensing generally begins with a reception of a most-significant-bit page at the circuit 122 from the circuit 112. The circuit 144 senses one or more corresponding lower-page intermediate-state pages from the circuit 126a-126n at one or more (possibly predefined) reference sensing voltages. The circuit 144 subsequently corrects the sensed lower-page intermediate-state pages. The lower-page intermediate-state page with the least detected errors is presented to the circuit 150. The circuit 150 combines the lower page received from the circuit 144 with the most-significant-bit page received from the circuit 122. The circuit 150 programs (writes) the most-significant-bit page/corrected lower-page intermediate-state page combination into the wordline from which the lower-page intermediate-state page was read.

Figure 7:
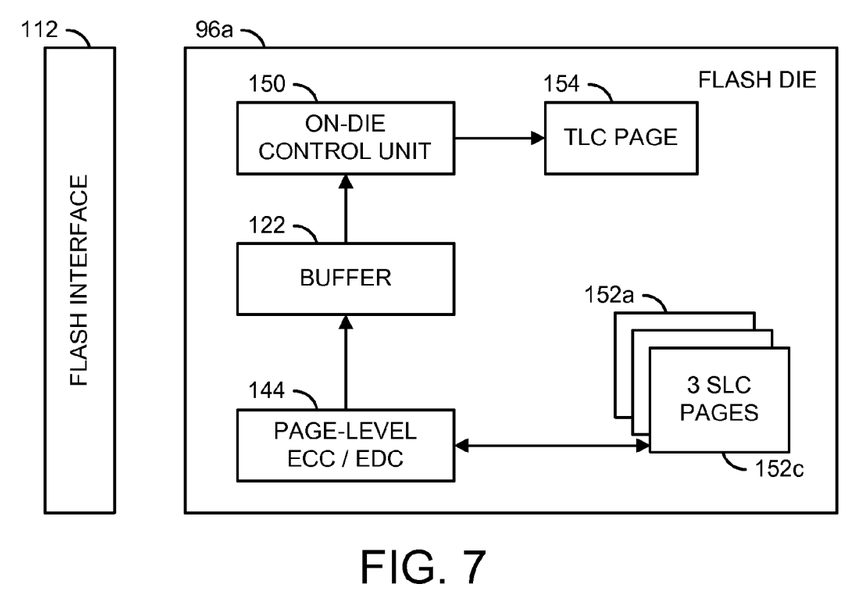
FIG. 7 is a diagram of single-level-cell multi-page compaction into a triple-level-cell page using on-die error detection and correction.

Referring to FIG. 7, a diagram of an example single-level cell multi-page compaction into a triple-level-cell page using on-die error detection and correction is shown. The circuit 96a generally comprises the circuit 122, the circuit 144, the circuit 150, multiple single-level-cell source pages 152a-152c and a triple-level-cell target page 154. The source pages 152a-152c are generally stored in one or more corresponding blocks 126a-126n. The target page 154 is programmed into one of the blocks 126a-126n. The compaction is generally performed totally on-die without involvement from the circuit 98.

The circuit 144 begins the compaction by reading multiple pages 152a-152c from one or more single-level-cell blocks 126a-126n and storing (or caching) the read pages 152a-152c within the flash memory (e.g., the circuit 122). The circuit 144 generally senses each page 152a-152c one or more times at a set of (possibly predefined) reference sensing voltages. The set of pages 152a-152c with the least total errors each detected by the circuit 146 are chosen for the compaction. The circuit 150 compacts (combines) the chosen set of pages 152a-152c into the triple-level page 154, three at a time. The circuit 150 subsequently write the triple-level page 154 back into the flash memory.

Figure 8:
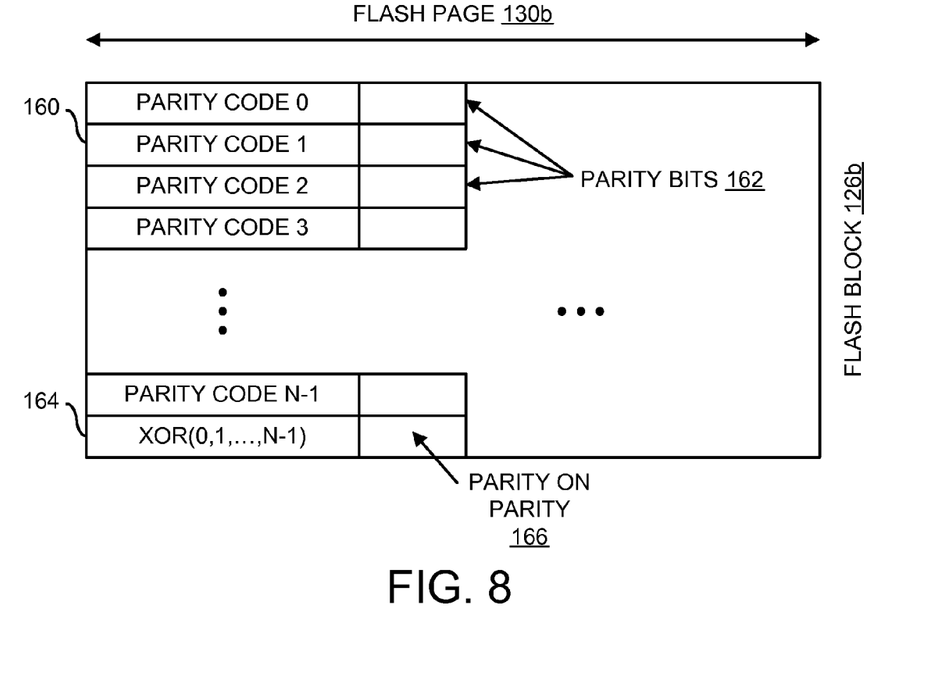
FIG. 8 is a diagram of another memory block.

Referring to FIG. 8, a diagram of an example block 126b is shown. The block 126b is representative of the other blocks 126a and 126c-126n. The block 126b (a portion of an erase block) generally comprises multiple pages each having a flash page width 130b. Each page generally comprises multiple parity codes 160 and parity bits 162. For example, the parity bits 162 may be adjoining (concatenated to) the parity codes 160. A last of the pages generally comprises an exclusive logical OR (e.g., XOR) 164 and a parity 166.

Each page is divided, for example, into 1-bit/256 single error correcting (e.g., SEC) Hamming codes 160. In various embodiments, the last page is a column-wise exclusive logical OR page of the previous pages. The exclusive OR data 164 in the last page is made from row-wise single error correcting Hamming codes 160. The parity 166 in the last page is a parity of the parity bits 162. A combined rate for a 256-page block is 0.992.

For triple-level-cell data compaction, the product code corrects any single-page failure of any type if all other row-wise codes are correct. Since a lower code rate is desired in the triple-level-cell pages, the column-wise code can also be a single error correcting Hamming code instead of the XOR code. For example, in a 512-page single-level-cell page, the row-wise and column-wise codes can be 1-bit/64-byte single error correcting Hamming codes. A resulting combined rate is generally 0.9614. The on-die code may not decode all errors as primarily the write errors are targeted for reduction and/or elimination. The on-die code does not have to guarantee error-free codewords to be paired for multi-level-cell compaction and/or triple-level-cell compaction. Any remaining errors are generally corrected by the controller error detection/error correction process when reading the compacted pages. Thus, errors are permitted to remain in the corrected single-level-cell pages.

Figure 9:
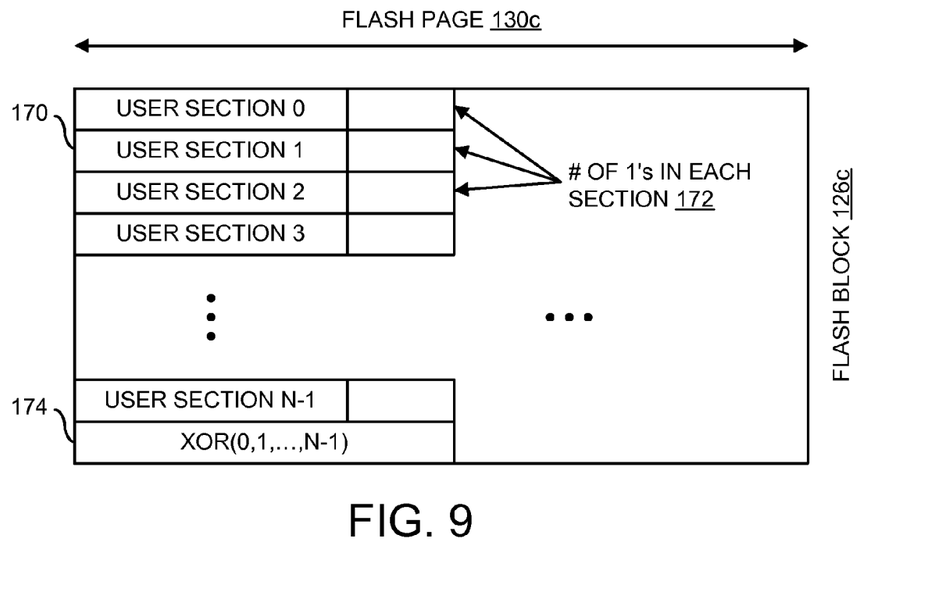
FIG. 9 is a diagram of still another memory block.

Referring to FIG. 9, a diagram of an example block 126c is shown. The block 126c is representative of the other blocks 126a-126b and 126d-126n. The block 126c (a portion of an erase block) generally comprises multiple pages each having a flash page width 130c. Each page generally comprises multiple users sections 170 and a corresponding count 172 of the number of 1's in each section 170. In various embodiments, the counts 172 are adjoining (concatenated to) the corresponding user sections 170. An exclusive logical OR (e.g., XOR) 174 of the user sections 170 and the counts 172 are stored in a last page.

The page is divided into small sections, and the number of extra ones beyond a 0.5 (50 percent zeros and 50 percent ones) disparity is counted and stored at the end 172. In some embodiments, the disparity is itself protected with an error correction code and/or is stored as multiple copies. The last page is the column-wise XOR of the previous pages. Simple counters or accumulators are used for encoding and decoding of row-wise "disparity codes". If asymmetric errors are the majority of errors, detection of any number of asymmetric errors is possible by counting the number of 1's when reading the pages, and comparing the count with the stored 1's count for that section. If the number of unsatisfied parity columns (using column-wise XOR checking) matches the number of asymmetric errors found row-wise, the error detection is assumed accurate. Multiple pre-specified sensing reference voltages are applied, and the reference voltage that reduces the number of asymmetric errors (difference between read disparity and write disparity at encoding time) throughout the whole lower-page intermediate-state page is paired with the most-significant-bit page to finalize the wordline programming:

Disparity-based row-wise codes are high code rates. Hence, a sufficient margin exists to utilize a column-wise single error correcting Hamming code or multiple error correcting BCH code to increase accuracy of the error detection, instead of a simple XOR for single-level-cell data compaction into the triple-level-cell pages. False positive/negatives are permitted since the primary aim is to detect as many write errors as practical.

Figure 10:
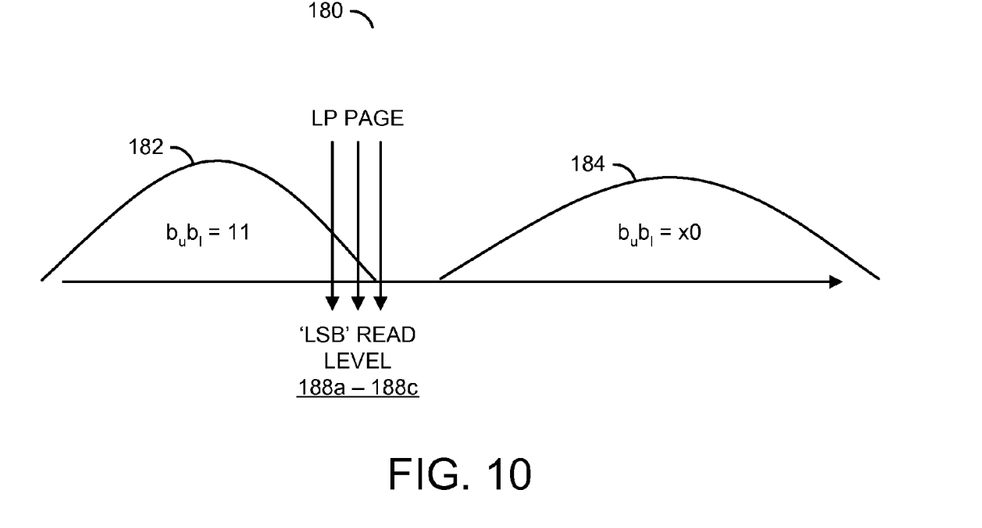
FIG. 10 is a diagram of error detection with multiple reads.

Referring to FIG. 10, a diagram of an example error detection with multiple reads 180 is shown. The example includes an erased state 182 (e.g., 11 bits) and an intermediate state 184 (e.g., X0 bits). Several reference voltages 188a-188c are used to read the least-significant-bit page.

For any type of row-wise error detection code (like a disparity code combined with a column-wise XOR or single error correcting Hamming code), the lower-page (e.g., LP) intermediate-state page is sensed multiple times (e.g., 188a-188c). The page with the least detected number of asymmetric errors, the page with no detected errors, or the page with a least number of unsatisfied parity checks, is paired with a most-significant-bit page to decide the final state of each cell in the wordline. A sensing reference voltage spacing delta and a number of sensing reference voltages is determined based on flash memory characterization. A small number of sensing reads is desirable to avoid damage in write throughput or latency in the single-level-cell page compaction.

Multiple sensing reads and the error detection/error corrections are run on the flash die and are transparent to the circuit 98. Multiple sensing of the single-level-cell pages can also be used in conjunction with a multi-page error detection/error correction to decide a good combination of sensed single-level-cell pages to combine when compacting into a triple-level-cell page. The single-level-cell pages are generally read from one or more single-level-cell blocks. The triple-level-cell page is generally written into a triple-level-cell block. Such an approach compensates for drift in the sensing reference voltages due mainly to endurance or read disturb. Retention born of the reference voltage drift is less of a concern as single-level-cell data is regularly compacted into triple-level-cell pages.

The functions performed by the diagrams of FIGS. 1-10 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a memory configured to program a lower unit into a lower page at a location, generate a corrected unit by correcting the lower unit read from the lower page at the location using a first error correction code, and program an upper unit into an upper page at the location based on the corrected unit, wherein the lower unit is encoded using the first error correction code and a second error correction code, and the upper unit is encoded using at least the second error correction code; and
a controller configured to process a plurality of input/output requests to read/write to/from the memory, and encode the lower unit and the upper unit using at least the second error correction code, wherein the memory transfers the lower unit read from the lower page at the location to the controller upon failing to fully correct the lower unit, and the controller generates the corrected unit in response to receiving the lower unit from the memory.

2. The apparatus according to claim 1, wherein the first error correction code has a higher code rate than the second error correction code.

3. The apparatus according to claim 1, wherein one of the controller or the memory is further configured to encode the lower unit using the first error correction code.

4. The apparatus according to claim 1, wherein the memory is further configured to generate a plurality of the corrected units by correcting a plurality of read pages programmed into the memory as single-level-cell data, generate a write page by combining the plurality of the corrected units into many-level-cell data, and program the write page into the memory.

5. The apparatus according to claim 1, wherein the memory is further configured to generate an intermediate unit by correcting the lower unit read from the lower page at the location using the first error correction code after the upper unit has been programmed.

6. The apparatus according to claim 1, wherein the first error correction code comprises one or more error detection and correction codes operating at one or more of a codeword level, a page level, and a multi-page level.

7. The apparatus according to claim 1, wherein the first error correction code utilizes a plurality of first parity bits concatenated to data, the second error correction code utilizes a plurality of second parity bits concatenated to the plurality of first parity bits, the first error correction code is systematic, and the second error correction code is systematic.

8. The apparatus according to claim 1, wherein the memory and the controller form part of a solid-state drive.

9. A method for on-die error detection and correction during multi-step programming, comprising the steps of:
   processing a plurality of input/output requests to read/write to/from a memory;
   programming a lower unit into a lower page at a location in the memory, wherein the lower unit is encoded using a first error correction code and a second error correction code;
   generating within the memory a corrected unit by correcting the lower unit read from the lower page at the location using the first error correction code;
   encoding within a controller the lower unit and an upper unit using at least the second error correction code;
   transferring the lower unit read from the lower page at the location from the memory to the controller upon failing to fully correct the lower unit;
   generating the corrected unit in the controller in response to receiving the lower unit from the memory; and
   programming the upper unit into an upper page at the location in the memory based on the corrected unit.

10. The method according to claim 9, wherein the first error correction code has a higher code rate than the second error correction code.

11. The method according to claim 9, further comprising the step of:
    encoding within one of the controller or the memory the lower unit using the first error correction code.

12. The method according to claim 9, further comprising the steps of:
    generating within the memory a plurality of the corrected units by correcting a plurality of read pages programmed in the memory as single-level-cell data;
    generating within the memory a write page by combining the plurality of the corrected units into many-level-cell data; and
    programming the write page into the memory.

13. The method according to claim 9, further comprising the step of:
    generating within the memory an intermediate unit by correcting the lower unit read from the lower page at the location using the first error correction code after the upper unit has been programmed.

14. The method according to claim 9, wherein the first error correction code comprises one or more error detection and correction codes operating at one or more of a codeword level, a page level, and a multi-page level.

15. The method according to claim 9, wherein the first error correction code utilizes a plurality of first parity bits concatenated to data, the second error correction code utilizes a plurality of second parity bits concatenated to the plurality of first parity bits, the first error correction code is systematic, and the second error correction code is systematic.

16. The method according to claim 9, wherein the steps are performed in a solid-state drive.

17. An apparatus comprising:
    a memory having a first decoder, wherein the memory is configured to program a lower unit into a lower page at a location, the lower unit is encoded using a first error correction code and a second error correction code, the first decoder is configured to generate a corrected unit by correcting the lower unit read from the lower page at the location using the first error correction code, the memory is further configured to program an upper unit into an upper page at the location based on the corrected unit, and the upper unit is encoded using at least the second error correction code; and
    a controller having an encoder and a second decoder, wherein the controller is configured to process a plurality of input/output requests to read/write to/from the memory, the encoder is configured to encode the lower unit and the upper unit using at least the second error correction code, the memory is further configured to transfer the lower unit read from the lower page at the location to the controller upon the first decoder failing to fully correct the lower unit, and the second decoder is configured to correct the lower unit.

18. The apparatus according to claim 17, wherein the memory and the controller form part of a solid-state drive.

19. The apparatus according to claim 5, wherein the controller is further configured to generate read data by correcting the intermediate unit using the second error correction code.

20. The method according to claim 13, further comprising the step of:
    generating within the controller read data by correcting the intermediate unit using the second error correction code.

* * * * *